(12) United States Patent
Shimotsusa

(10) Patent No.: US 9,324,744 B2
(45) Date of Patent: Apr. 26, 2016

(54) SOLID-STATE IMAGE SENSOR HAVING A TRENCH AND METHOD OF MANUFACTURING THE SAME

(71) Applicant: CANON KABUSHIKI KAISHA, Tokyo (JP)

(72) Inventor: Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/770,307

(22) Filed: Feb. 19, 2013

(65) Prior Publication Data

US 2013/0222657 A1  Aug. 29, 2013

(30) Foreign Application Priority Data

Feb. 29, 2012  (JP) .................................. 2012-044299

(51) Int. Cl.
| | |
|---|---|
| *H04N 3/14* | (2006.01) |
| *H04N 5/335* | (2011.01) |
| *H01L 27/146* | (2006.01) |
| *H01L 31/18* | (2006.01) |

(52) U.S. Cl.
CPC ...... *H01L 27/14601* (2013.01); *H01L 27/1463* (2013.01); *H01L 27/14625* (2013.01); *H01L 27/14636* (2013.01); *H01L 31/18* (2013.01); *H01L 27/14609* (2013.01)

(58) Field of Classification Search
CPC .................... H01L 27/14609; H01L 27/1463; H01L 27/14601
USPC ................................... 348/294; 257/432, 448
See application file for complete search history.

(56) References Cited

U.S. PATENT DOCUMENTS

| | | | |
|---|---|---|---|
| 5,910,701 A * | 6/1999 | Takemura | 313/309 |
| 7,411,170 B2 | 8/2008 | Shimotsusa et al. | 250/208.1 |
| 7,495,206 B2 | 2/2009 | Park | 250/214.1 |
| 7,935,557 B2 | 5/2011 | Mishima et al. | 438/60 |
| 8,022,525 B2 | 9/2011 | Maebashi et al. | 257/686 |
| 8,049,296 B2 | 11/2011 | Miyakawa et al. | 257/508 |
| 8,274,122 B2 | 9/2012 | Shimotsusa | 257/432 |
| 8,456,014 B2 | 6/2013 | Kobayashi et al. | |
| 8,848,075 B2 | 9/2014 | Takahashi et al. | |
| 8,947,566 B2 | 2/2015 | Kobayashi et al. | |
| 9,209,220 B2 | 12/2015 | Kobayashi et al. | |
| 2008/0054759 A1* | 3/2008 | Ayazi et al. | 310/309 |
| 2011/0084350 A1* | 4/2011 | Murakoshi et al. | 257/432 |
| 2011/0234868 A1 | 9/2011 | Yamashita et al. | 348/294 |
| 2013/0141833 A1* | 6/2013 | Moslehi et al. | 361/234 |
| 2014/0339667 A1 | 11/2014 | Takahashi et al. | |

FOREIGN PATENT DOCUMENTS

| | | |
|---|---|---|
| JP | 2005-285814 A | 10/2005 |
| JP | 2006-191081 A | 7/2006 |

(Continued)

*Primary Examiner* — Antoinette Spinks
(74) *Attorney, Agent, or Firm* — Fitzpatrick, Cella, Harper & Scinto

(57) ABSTRACT

A solid-state image sensor includes a semiconductor layer, a multilayer wiring layer, an opening which extends through the semiconductor layer, and reaches an electrically conductive layer in the multilayer wiring layer, an electrically conductive member arranged in the opening so as to be connected to the electrically conductive layer, and a trench which surrounds the opening, and extends through the semiconductor layer, the trench having a space with no solid substance, and the semiconductor layer including a wall portion arranged between a side face defining the opening, and an inner-side face defining the trench to surround the electrically conductive member.

25 Claims, 11 Drawing Sheets

(56) References Cited

FOREIGN PATENT DOCUMENTS

| JP | 2007-59769 A | 3/2007 |
| JP | 2009-194249 A | 8/2009 |
| JP | 2010-109137 A | 5/2010 |
| JP | 2011-86709 A | 4/2011 |
| JP | 2011-096851 A | 5/2011 |
| JP | 2011-243656 A | 12/2011 |
| JP | 2012-033878 A | 2/2012 |

* cited by examiner

F I G. 4A
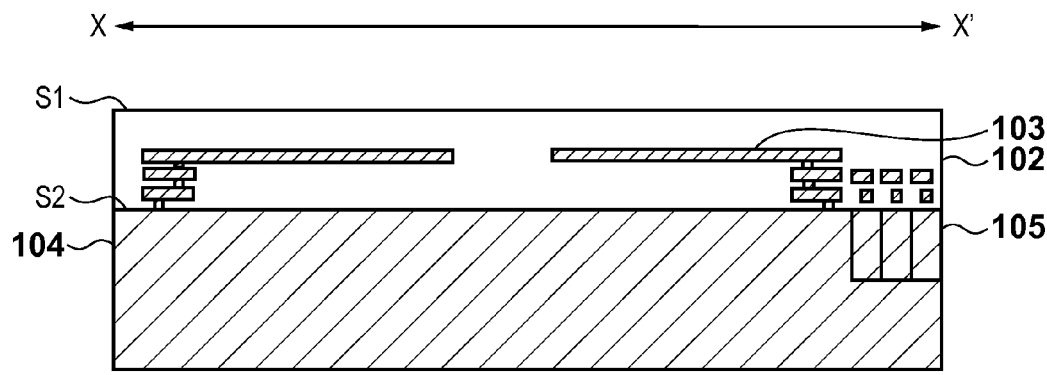
F I G. 4B
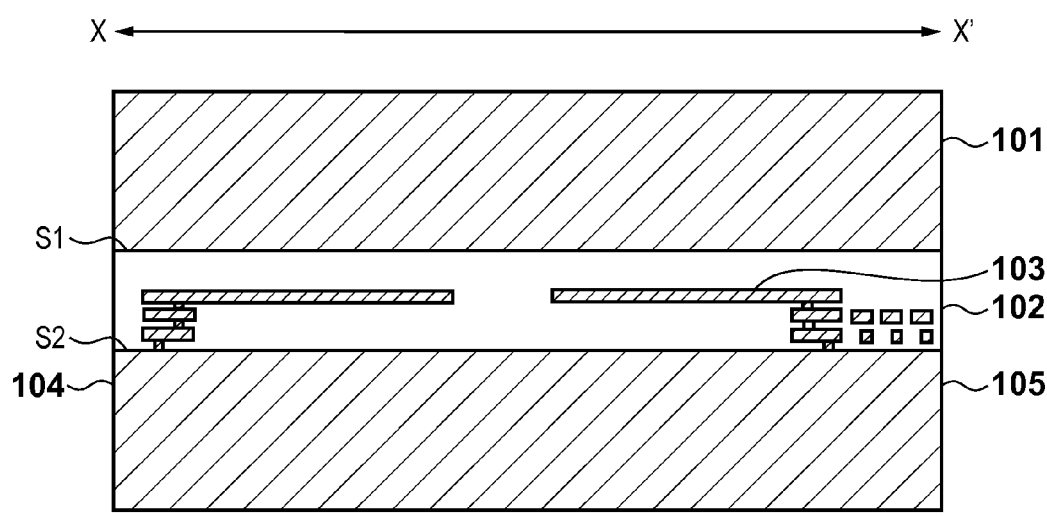

SOLID-STATE IMAGE SENSOR HAVING A TRENCH AND METHOD OF MANUFACTURING THE SAME

BACKGROUND OF THE INVENTION

1. Field of the Invention

The present invention relates to a solid-state image sensor and a method of manufacturing the same.

2. Description of the Related Art

Japanese Patent Laid-Open No. 2006-191081 discloses an image sensor formed by uniting a member constituting a light-receiving portion, and a member constituting a peripheral circuit which drives it to each other. The member constituting the light-receiving portion includes microlenses, color filters, photodiodes, transfer transistors, and metal lines. The member constituting the peripheral circuit includes metal lines to be connected to those of the light-receiving portion, a substrate on which a source/drain region is formed, an insulation film, a pad, and a connecting portion which extends through the insulation film and the substrate to connect the pad and the metal lines to each other.

In a configuration described in Japanese Patent Laid-Open No. 2006-191081, the connecting portion which extends through the substrate is in contact with the substrate, so a plurality of pads, if used, may be imperfectly insulated from each other. Although a method of forming a connecting portion after side faces defining through holes formed in the substrate are covered with an insulator is also available, an insulation film must be stably formed on the side faces defining deep through holes in this case.

SUMMARY OF THE INVENTION

The present invention discloses a technique advantageous in terms of reliably insulating electrically conductive members, arranged to extend through a semiconductor layer, with a simple method.

One of aspects of the present invention provides a solid-state image sensor including a semiconductor layer and a multilayer wiring layer, the sensor comprising: an opening which extends through the semiconductor layer, and reaches an electrically conductive layer in the multilayer wiring layer; an electrically conductive member arranged in the opening so as to be connected to the electrically conductive layer; and a trench which surrounds the opening, and extends through the semiconductor layer, the trench having a space with no solid substance, and the semiconductor layer including a wall portion arranged between a side face defining the opening, and an inner-side face defining the trench to surround the electrically conductive member.

Further features of the present invention will become apparent from the following description of exemplary embodiments with reference to the attached drawings.

BRIEF DESCRIPTION OF THE DRAWINGS

FIG. 4A is a schematic sectional view for explaining a method of manufacturing a solid-state image sensor according to the first embodiment;

FIG. 4B is a schematic sectional view for explaining the method of manufacturing a solid-state image sensor according to the first embodiment;

DESCRIPTION OF THE EMBODIMENTS

A solid-state image sensor according to the present invention is applicable to various image sensors such as a MOS image sensor and a CCD image sensor. Also, the solid-state image sensor according to the present invention can be used both as a solid-state image sensor including a multilayer wiring layer arranged on the face, opposite to the light incident face, of the two faces of a semiconductor layer in which photoelectric conversion elements are formed, and a solid-state image sensor which receives light incident on the photoelectric conversion elements through openings formed in a multilayer wiring layer. The former serves as a so-called back-side illumination solid-state image sensor, which can be provided with electrodes for bonding on either the light incident face or the face opposite to it. The latter serves as a conventionally mainstream solid-state image sensor, which will be referred to as a front-side illumination solid-state image sensor hereinafter for the sake of convenience.

An example in which a solid-state image sensor and a method of manufacturing the same according to the present invention are applied to a back-side illumination solid-state image sensor and a method of manufacturing the same will be described below. However, the present invention is also applicable to a front-side illumination solid-state image sensor and a method of manufacturing the same. When the present invention is applied to a front-side illumination solid-state image sensor and a method of manufacturing the same, electrodes for bonding in the latter can typically be arranged on the face, opposite to the light incident face, of the two faces of a semiconductor layer in which photoelectric conversion elements are formed.

First Embodiment

Figure 3:
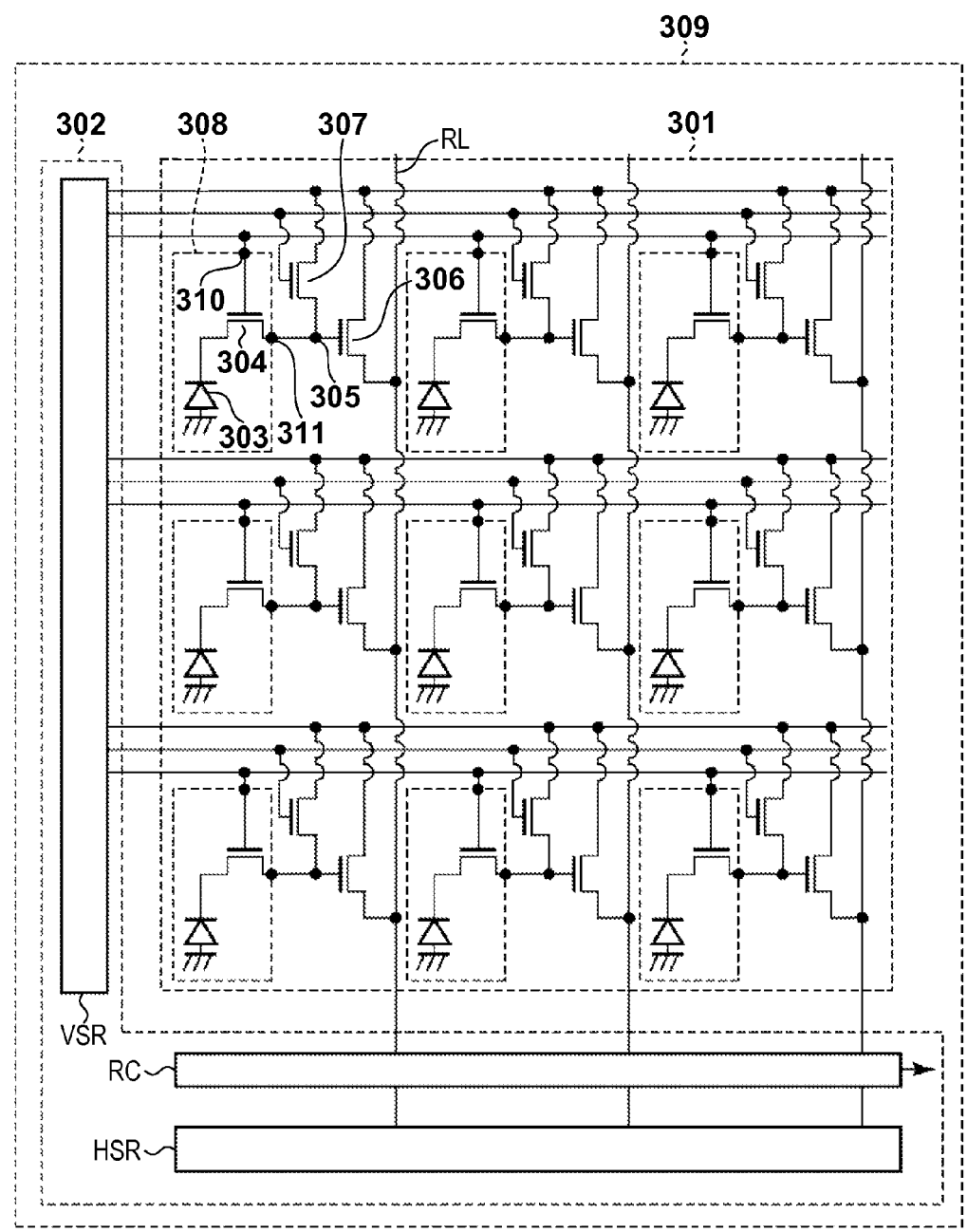
FIG. 3 is a circuit diagram showing the circuit configuration of the solid-state image sensor according to the first embodiment.

An exemplary circuit configuration of a solid-state image sensor that is commonly applicable to the following embodiments will be described with reference to FIG. 3. The case wherein a signal charge is an electron will be taken as an example herein. The solid-state image sensor includes a pixel portion 301 in which a plurality of photoelectric conversion elements 303 are arrayed, and a peripheral circuit portion 302 including a control circuit for reading out a signal from the pixel portion 301, and a signal processing circuit for processing the readout signal.

The pixel portion 301 includes a plurality of photoelectric conversion elements 303, a plurality of transfer transistors 304, a plurality of amplifier transistors 306, and a plurality of reset transistors 307. Viewed from another perspective, the pixel portion 301 includes a plurality of pixels, each of which includes one photoelectric conversion element 303. In an example shown in FIG. 3, each pixel includes the photoelectric conversion element 303, transfer transistor 304, amplifier transistor 306, and reset transistor 307. In another example, the amplifier transistor 306 and reset transistor 307 can be shared by a plurality of pixels (a plurality of photoelectric conversion elements 303).

The transfer transistor 304 has its source connected to the photoelectric conversion element 303, and its drain connected to the gate electrode of the amplifier transistor 306. A node that connects the gate electrode of the transfer transistor 304 with that of the amplifier transistor 306 serves as a node 305. The reset transistor 307 is connected to the node 305, which has a potential set to an arbitrary potential (for example, a reset potential). The amplifier transistor 306 partially forms a source follower circuit, and outputs a signal corresponding to the potential of the node 305 to a signal line RL. The node 305 can be called a floating diffusion.

The peripheral circuit portion 302 can be considered as a portion other than the pixel portion 301. The peripheral circuit portion 302 can include a vertical scanning circuit VSR as a control circuit for supplying a control signal to the gate electrode of each transistor of the pixel portion 301. The peripheral circuit portion 302 can also include a readout circuit RC which holds a signal output from the pixel portion 301, and performs signal processing including amplification, addition, and A/D conversion. The peripheral circuit portion 302 can moreover include a horizontal scanning circuit HSR as a control circuit which controls the timings at which signals are sequentially output from the readout circuit RC.

An exemplary two-dimensional layout of the solid-state image sensor will be described below with reference to FIG. 2. A chip 111 configured as the solid-state image sensor includes the pixel portion 301, the peripheral circuit portion 302, and a pad portion P. The photoelectric conversion elements 303 are arranged in the pixel portion 301, while the horizontal scanning circuit HSR, vertical scanning circuit VSR, and readout circuit RC are arranged in the peripheral circuit portion 302. The pad portion P includes openings 108, metal electrodes (electrically conductive members) 110 arranged in the openings 108, and a trench 109 which surrounds the openings 108. Note that wall portions WP made of a semiconductor are formed between the side faces defining the openings 108, and the inner-side faces defining the trench 109. The wall portions WP are part of a semiconductor layer to be described below.

Figure 1:
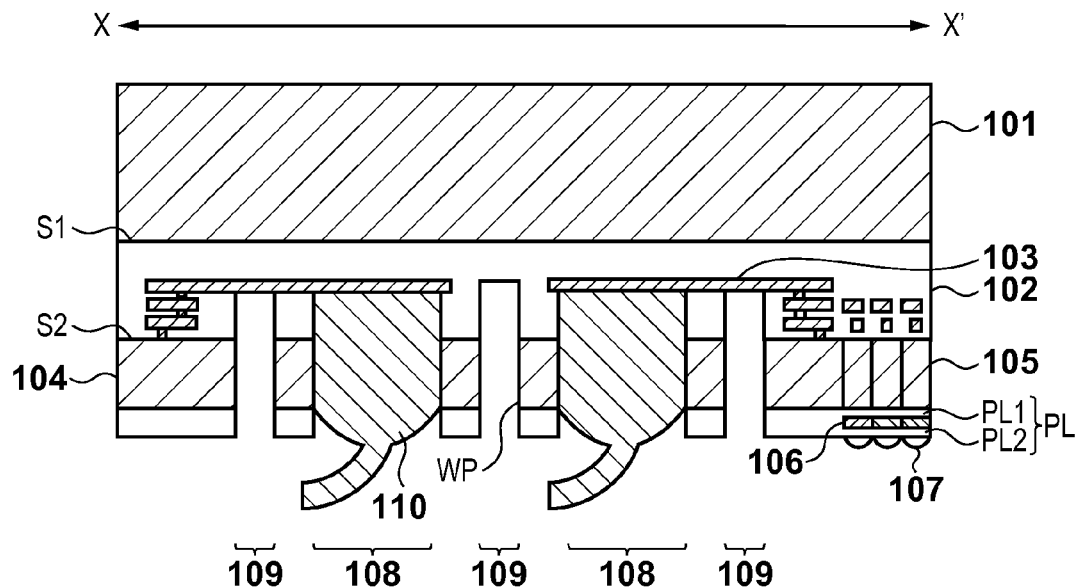
FIG. 1 is a sectional view schematically showing the cross-sectional structure of a solid-state image sensor according to the first embodiment.
Figure 2:
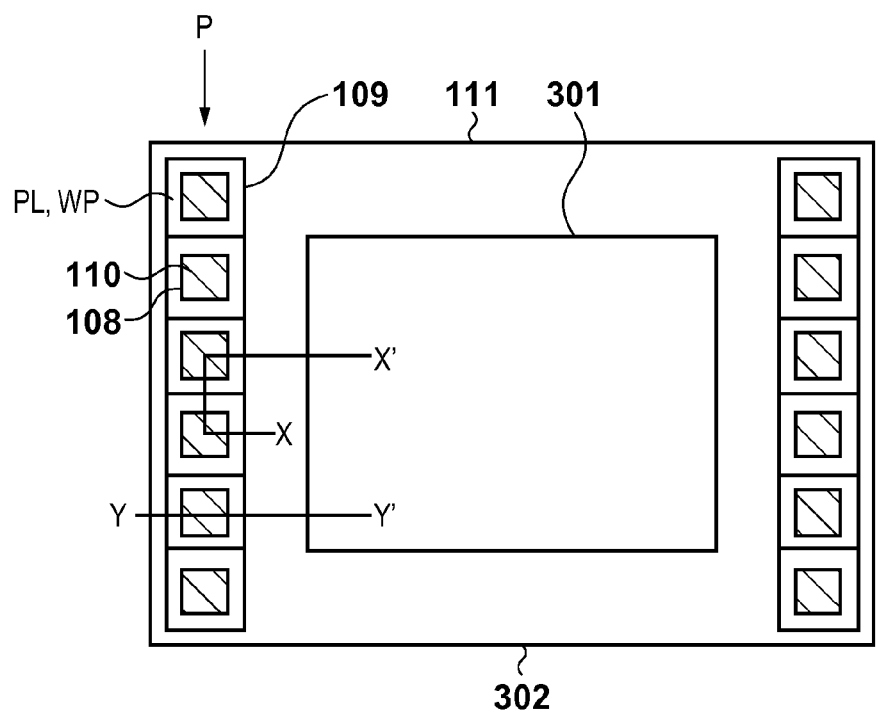
FIG. 2 is a view schematically showing the two-dimensional layout of the solid-state image sensor according to the first embodiment.

FIG. 1 is a sectional view schematically showing a cross-sectional structure taken along a line X-X' in FIG. 2. The solid-state image sensor according to the first embodiment includes a semiconductor layer 104 and multilayer wiring layer 102. The solid-state image sensor according to the first embodiment also includes openings 108 which extend through the semiconductor layer 104, and reach an electrically conductive layer 103 in the multilayer wiring layer 102, and a trench 109 which surrounds the openings 108 and extends through the semiconductor layer 104. The solid-state image sensor according to the first embodiment moreover includes metal electrodes 110 arranged in the openings 108 so as to be connected to the electrically conductive layer 103. The semiconductor layer 104 includes wall portions WP arranged between the side faces defining the openings 108, and the inner-side faces defining the trench 109 to surround the metal electrodes 110.

The semiconductor layer 104 is formed by a semiconductor such as silicon. Photoelectric conversion elements 105 (corresponding to the above-mentioned photoelectric conversion elements 303) are formed in the semiconductor layer 104. Note that as an example, the semiconductor layer 104 can include a p-type semiconductor region, and the photoelectric conversion element 105 can include an n-type semiconductor region serving as a charge accumulation region. The photoelectric conversion element 105 is, for example, a photodiode, and includes a semiconductor layer and n-type semiconductor region. The multilayer wiring layer 102 is formed by stacking a plurality of metal wiring layers and a plurality of interlayer insulation films (insulation films in which contact plugs are formed, and those in which via plugs are formed). The plurality of metal wiring layers include the electrically conductive layer 103 to which the metal electrodes 110 are to be connected.

A supporting substrate 101 can be united to the face, opposite to that on which the semiconductor layer 104 is arranged, of the two faces of the multilayer wiring layer 102. The supporting substrate 101 can be, for example, a silicon substrate. When the supporting substrate 101 is united to the multilayer wiring layer 102 with no adhesive material, a silicon substrate is suitable as the supporting substrate 101. Color filters 106, on-chip lenses 107, and a planarizing layer PL can be arranged on the side of a second face (back face) S2 of the semiconductor layer 104. The solid-state image sensor according to the first embodiment serves as a back-side illumination solid-state image sensor in which light enters the photoelectric conversion elements 105 through the on-chip lenses 107 arranged on the side of the second face (back face) S2 of the semiconductor layer 104.

The openings 108 are formed to extend through the semiconductor layer 104 from the side of the second face (back face) S2 of the semiconductor layer 104, and reach the electrically conductive layer 103 in the multilayer wiring layer 102. The trench 109 which surrounds the openings 108 is formed to extend through the semiconductor layer 104 from the side of the second face (back face) S2 of the semiconductor layer 104. The trench 109 is arranged to isolate a plurality of openings 108 from each other, as illustrated in FIG. 2.

The metal electrodes 110 are arranged in the openings 108. The metal electrodes 110 can be connected to the pins of a package which encapsulates the chip 111 via bonding wires. The metal electrodes 110 are connected to the electrically conductive layer 103 in the multilayer wiring layer 102. The metal electrodes 110 can be formed by a method such as bonding, bump formation, or plating. The metal electrodes 110 can be formed by a material such as gold, silver, or aluminum. The trench 109 has a space with no solid substance.

A method of manufacturing a solid-state image sensor according to the first embodiment will be described with reference to FIGS. 4A to 4D. FIGS. 4A to 4D are sectional views showing the same portion (the cross-section taken along the line X-X' in FIG. 2) as in FIG. 1. This method will be described with reference to FIG. 4A. A semiconductor layer 104 is prepared. The semiconductor layer 104 is, for example, a silicon substrate. First, element isolation (not shown) is formed on a first face (front face) S1 of the semiconductor layer 104. The element isolation includes an insulation layer such as a silicon oxide film, and has, for example, the STI structure. A well (not shown) is formed in the semiconductor layer 104. A photoelectric conversion element 105, and n- and p-type semiconductor regions (neither is shown) which form transistors (not shown) are formed. A gate electrode layer is formed on the semiconductor layer 104 through gate oxide film. The gate electrode layer is formed by depositing and patterning, for example, a polysilicon layer, and can include not only gate electrodes but also interconnections connected to them.

A multilayer wiring layer 102 is formed on the first face (front face) S1 of the semiconductor layer 104. More specifically, first, a film to serve as an interlayer insulation film is formed to cover the gate electrode layer. That is, contact holes are formed in a film to serve as an interlayer insulation film, films of a barrier metal and tungsten are formed, and unnecessary portions of the films of the barrier metal and tungsten are removed to form an interlayer insulation film and contact plugs. Films of a barrier metal and aluminum are formed on the interlayer insulation film, and these films are patterned to form a wiring layer. A multilayer wiring layer 102 is formed by repeating the formation of a film to serve as an interlayer insulation film, the formation of via holes and via plugs, and the formation of a wiring layer. A copper interconnection and a damascene process can be used for a wiring layer and its formation, respectively. With the above-mentioned operation, a configuration shown in FIG. 4A is obtained. Although an electrically conductive layer 103 is arranged in the top layer of the multilayer wiring layer 102 in an example shown in FIG. 4A, it is not limited to this example, and may be arranged in any layer within the multilayer wiring layer 102.

The description of the above-mentioned method will be continued with reference to FIG. 4B. The lower face of the supporting substrate 101 is united to the upper face of the multilayer wiring layer 102. The upper face of the multilayer wiring layer 102 is formed by an insulation film, and planarized by, for example, CMP or etching. The lower face of the supporting substrate 101 is also flat. The supporting substrate 101 can be, for example, a silicon substrate or a glass substrate. The supporting substrate 101 preferably is united to the multilayer wiring layer 102 in a vacuum or in an inert gas atmosphere. Also, it is desired to irradiate the upper face of the multilayer wiring layer 102 and the lower face of the supporting substrate 101 with a plasma before uniting. With this plasma irradiation operation, the strength of bonding between insulation films such as a silicon oxide film and a silicon nitride film becomes higher than that with no plasma irradiation operation. Not only the plasma irradiation method but also a method of activating the uniting face by a chemical treatment can be adopted. An adhesive material can also be used for uniting. Benzocyclobutene, for example, can be used as the adhesive material, and allows uniting at about 250° C. The upper face of the multilayer wiring layer 102 and the lower face of the supporting substrate 101 require a flatness lower in a uniting operation which uses an adhesive material than in that which uses no adhesive material.

Figure 4C:
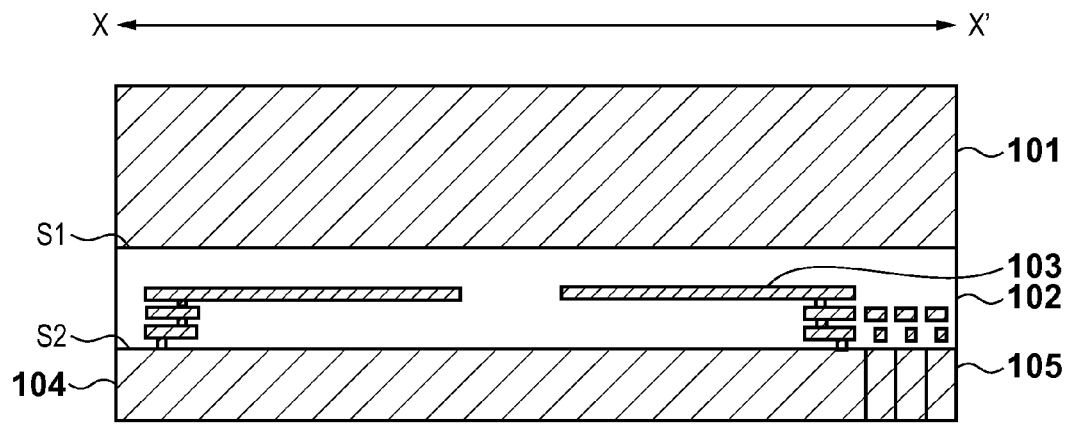
FIG. 4C is a schematic sectional view for explaining the method of manufacturing a solid-state image sensor according to the first embodiment.

The description of the above-mentioned method will be continued with reference to FIG. 4C. The semiconductor layer 104 is thinned from the side of its second face (back face) S2. The semiconductor layer 104 can be thinned by a method such as grinding, CMP, or etching. Thinning the semiconductor layer 104 allows incident light to efficiently reach the photoelectric conversion elements 105. This contributes to improving the sensitivity of the photoelectric conversion elements 105. The semiconductor layer 104 can be made thinner than the supporting substrate 101 upon the thinning operation.

Figure 4D:
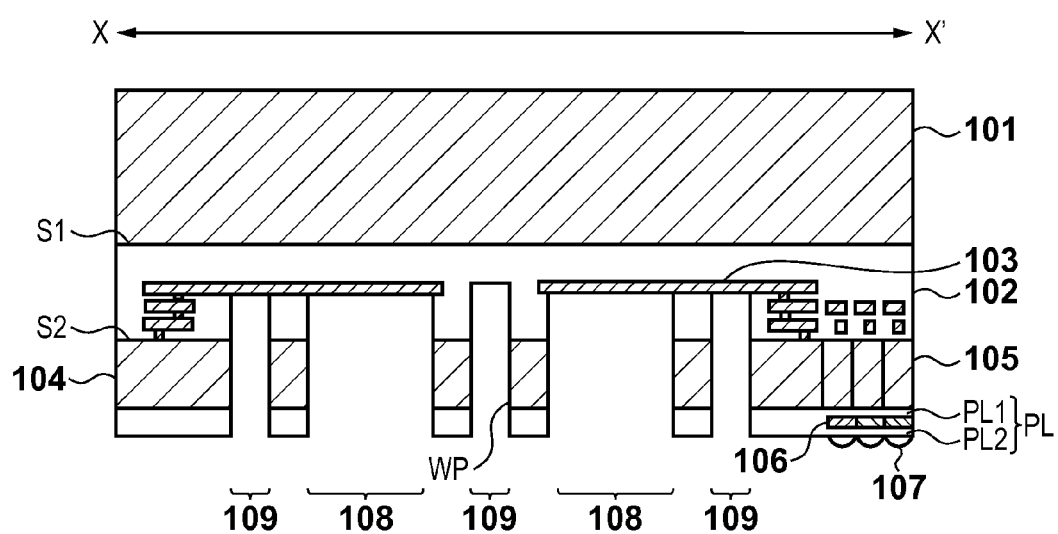
FIG. 4D is a schematic sectional view for explaining the method of manufacturing a solid-state image sensor according to the first embodiment.

The description of the above-mentioned method will be continued with reference to FIG. 4D. A planarizing layer PL1 made of a resin, color filters 106, a planarizing layer PL2 made of a resin, and on-chip lenses 107 are formed on the second face (back face) S2 of the semiconductor layer 104 in the order named. The planarizing layers PL1 and PL2 will be collectively referred to as a planarizing layer PL hereinafter. Openings 108 and a trench 109 are formed in the semiconductor layer 104 and multilayer wiring layer 102. The openings 108 are formed to extend through the semiconductor layer 104, and reach the electrically conductive layer 103. The trench 109 is formed to extend through the semiconductor layer 104, and isolate a plurality of openings 108 from each other.

The openings 108 and trench 109 can be formed by forming a resist pattern having openings in regions where they are to be formed, and etching the planarizing layer PL, semiconductor layer 104, and multilayer wiring layer 102 using the resist pattern as an etching mask. More specifically, a resist is applied to cover the planarizing layer PL and on-chip lenses 107, and is exposed to light and developed to form a resist pattern. The planarizing layer PL is processed by dry etching using a gas containing, for example, $C_4F_8$ to expose the semiconductor layer 104. The etched portions to serve as the openings 108 and trench 109 are extended through the semiconductor layer 104 while repeating a step of etching the semiconductor layer 104 using a gas containing $SF_6$, and a step of protecting the resist pattern using a gas containing $C_4F_8$. The multilayer wiring layer 102 is etched using a gas containing, for example, $C_4F_8$ until the openings 108 reach the electrically conductive layer 103. At this time, the openings 108 and trench 109 are formed simultaneously.

Although etching for forming the openings 108 stops the moment they reach the electrically conductive layer 103, it does not stop if the trench 109 does not reach a layer at the same depth as the electrically conductive layer 103. Hence, the depths of the openings 108 and trench 109 may be equal in a portion where the trench 109 reaches the layer at the same depth as the electrically conductive layer 103, while the depth of the trench 109 may be larger than that of the openings 108 in a portion where the trench 109 does not reach the layer at the same depth as the electrically conductive layer 103. After the openings 108 and trench 109 are formed, a hardened layer on the surface of the resist pattern is removed by dry etching using a gas containing $CF_4$. The resist pattern is removed using a gas containing $O_2$.

Figure 5:
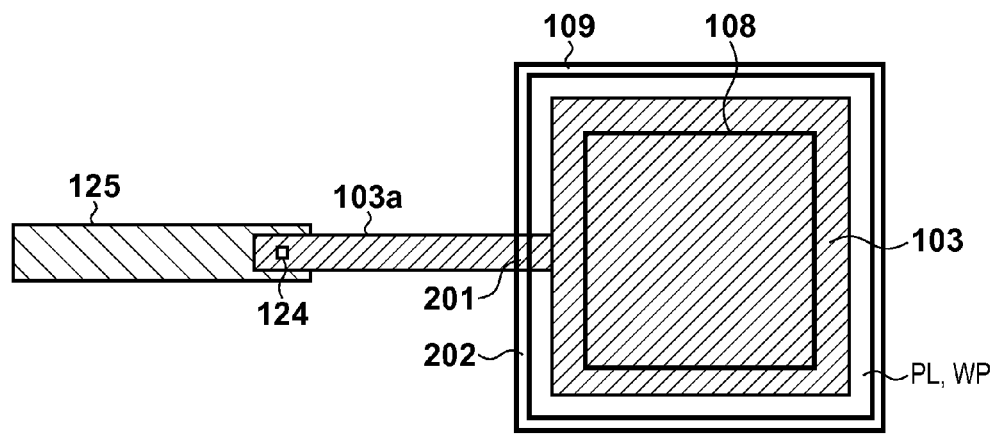
FIG. 5 is a view schematically showing a partial configuration of the solid-state image sensor according to the first embodiment.

The relationship among the opening 108, the trench 109, and the electrically conductive layer 103 will be described below with reference to FIG. 5. FIG. 5 is a perspective view schematically showing the regions of the opening 108, trench 109, and electrically conductive layer 103. The opening 108 can be formed within the region of the electrically conductive layer 103. Although the trench 109 may wholly be formed within the region of the electrically conductive layer 103, it may partly be arranged outside the region of the electrically conductive layer 103, as illustrated in FIG. 5. In an example shown in FIG. 5, in a region 201, the trench 109 is formed in a region of an interconnection 103a connected to the electrically conductive layer 103. Note that the electrically conductive layer 103 and interconnection 103a serve as patterns formed in the same layer. In a region 202, the electrically conductive layer 103 and interconnection 103a are absent at the bottom of the trench 109.

The electrically conductive layer 103 and interconnection 103a are connected to an interconnection 125, different from the electrically conductive layer 103 and interconnection 103a, via a contact plug 124. The electrically conductive layer 103 can have a side of, for example, about 50 to 100 µm. The opening 108 is formed to be slightly smaller than the electrically conductive layer 103, and can have a side of about 90 µm if the electrically conductive layer 103 has a side of, for example, 100 µm. Although the electrically conductive layer 103 and opening 108 are squares in FIG. 5, they may have other shapes. The trench 109 can have a width of, for example, about several micrometers. The semiconductor layer 104 and multilayer wiring layer 102 can have thicknesses of, for example, about several micrometers.

After the openings 108 and trench 109 are formed, metal electrodes 110 are formed in the openings 108, as illustrated in FIG. 1. The metal electrodes 110 are formed to be connected to the electrically conductive layer 103. The metal electrodes 110 can be formed by a method such as bonding, bump formation, or plating. The metal electrodes 110 can be formed by a material such as gold, silver, or aluminum. The trench 109 has a space with no solid substance. The trench 109 has a function of isolating the metal electrodes 110 surrounded by the trench 109.

Note that the metal electrodes 110 are likely to be arranged in contact with the semiconductor layer 104. Also, the metal electrodes 110 are likely to come into contact with the semiconductor layer 104 upon deformation while the solid-state image sensor is in use. When one metal electrode 110 comes into contact with the semiconductor layer 104, it may be electrically connected to other metal electrodes 110 via the semiconductor layer 104. When one metal electrode 110 is electrically connected to other metal electrodes 110 in this way, the solid-state image sensor can no longer operate normally. Even if, for example, very low current flows between one metal electrode 110 and other metal electrodes 110, this may degrade their properties or cause erroneous operations.

According to the first embodiment, the trench 109 is formed around the openings 108, in which the metal electrodes 110 are formed to be connected to the electrically conductive layer 103 in the multilayer wiring layer 102, to extend through the semiconductor layer 104. Therefore, even if the metal electrodes 110 come into contact with the semiconductor layer 104, no electrical connection occurs between different metal electrodes 110. Since the openings 108 and trench 109 can be formed simultaneously, it is possible to suppress an increase in number of steps, and, in turn, to suppress a rise in manufacturing cost.

A method of manufacturing a solid-state image sensor according to the present invention is not limited to the above-mentioned manufacturing method, and various changes can be made. For example, before formation of a planarizing layer PL, color filters 106, and on-chip lenses 107, openings 108 and a trench 109 may be formed. In this case, after the openings 108 and trench 109 are formed, they preferably are filled with a resin and planarized. This is because to form color filters 106 and on-chip lenses 107 with high accuracy, no steps preferably are present in their underlayer. Upon this operation, a step of removing the resin that fills the openings 108 and trench 109 is necessary after the color filters 106 and on-chip lenses 107 are formed. This can be done by forming a resist pattern having openings in portions corresponding to the openings 108 and trench 109, and etching or asking the resin using the resist pattern as a mask. Alternatively, if the resin is an insulator, the resin only in the openings 108 of the openings 108 and trench 109 may be removed.

The semiconductor layer 104 can be formed using, for example, a bulk semiconductor substrate or an SOI (Silicon On Insulator or Semiconductor ON Insulator) substrate.

Second Embodiment

Figure 6:
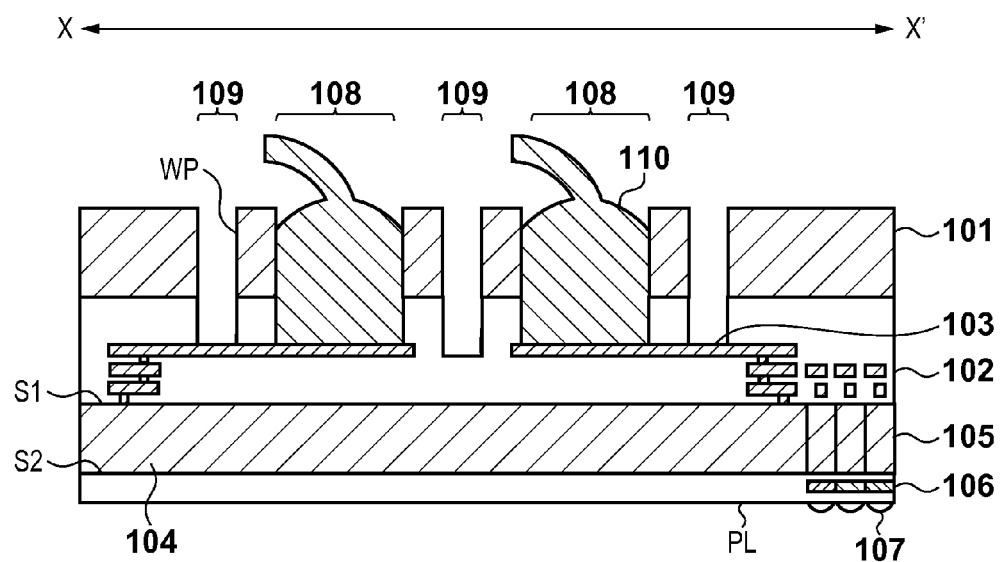
FIG. 6 is a sectional view schematically showing the cross-sectional structure of a solid-state image sensor according to the second embodiment.

A solid-state image sensor and a method of manufacturing the same according to the second embodiment of the present invention will be described with reference to FIG. 6. FIG. 6 is a sectional view schematically showing a cross-sectional structure taken along a line X-X' in FIG. 2 according to the second embodiment. Details which are not particularly referred to herein can be the same as in the first embodiment. In the second embodiment, openings 108, a trench 109, and metal electrodes 110 are formed in a semiconductor layer serving as a supporting substrate 101 arranged on the side of a first face S1 of a semiconductor layer (second semiconductor layer) 104 in which photoelectric conversion elements 105 are formed, of its first face S1 and second face S2. This means that in the second embodiment, the openings 108, trench 109, and metal electrodes 110 are formed on the face, opposite to the light incident face, of the semiconductor layer 104. The solid-state image sensor according to the second embodiment also serves as a back-side illumination solid-state image sensor in which light enters the photoelectric conversion elements 105 through on-chip lenses 107 arranged on the side of the second face (back face) S2 of the semiconductor layer 104, of its first face S1 and second face S2.

The semiconductor layer 104, the photoelectric conversion elements 105, a multilayer wiring layer 102, an electrically conductive layer 103, color filters 106, and the on-chip lenses 107 are the same as in the first embodiment. The supporting substrate 101 is united to the multilayer wiring layer 102 and supports the multilayer wiring layer 102 and semiconductor layer 104. The solid-state image sensor according to the second embodiment has a structure in which the multilayer wiring layer 102 is arranged between the supporting substrate 101 and the semiconductor layer 104.

A semiconductor layer serving as the supporting substrate 101 can be implemented by a semiconductor substrate such as a silicon substrate. When no adhesive material is used to unite the supporting substrate 101 to the multilayer wiring layer 102, the supporting substrate 101 preferably is a silicon substrate.

The openings 108 are formed to extend through the semiconductor layer serving as the supporting substrate 101, and reach the electrically conductive layer 103 in the multilayer wiring layer 102. The trench 109 which surrounds the openings 108 is formed to extend through the semiconductor layer serving as the supporting substrate 101. The trench 109 is arranged to isolate a plurality of openings 108 from each other, as illustrated in FIG. 2. Although the electrically conductive layer 103 is arranged in the top layer of the multilayer wiring layer 102 in an example shown in FIG. 6, it is not limited to this example, and may be arranged in any layer within the multilayer wiring layer 102.

The metal electrodes 110 are arranged in the openings 108. The metal electrodes 110 can be connected to the pins of a package which encapsulates a chip 111 via bonding wires. The metal electrodes 110 are connected to the electrically conductive layer 103 in the multilayer wiring layer 102. The metal electrodes 110 can be formed by a method such as bonding, bump formation, or plating. When the metal electrodes 110 are formed by, for example, bump formation, the solid-state image sensor according to the second embodiment is more advantageous than that according to the first embodiment in terms of reducing the package area.

Third Embodiment

Figure 7:
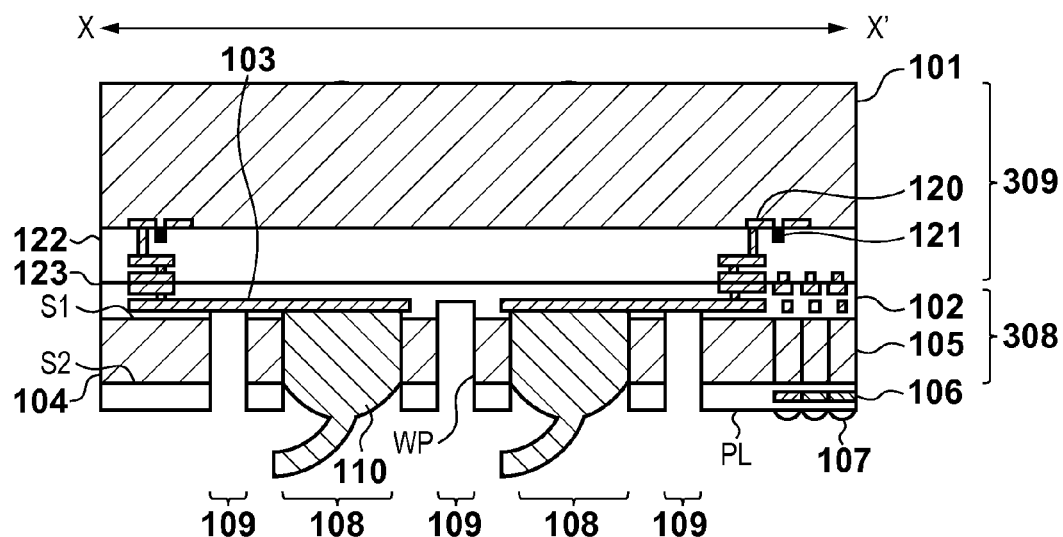
FIG. 7 is a sectional view schematically showing the cross-sectional structure of a solid-state image sensor according to the third embodiment.

A solid-state image sensor and a method of manufacturing the same according to the third embodiment of the present invention will be described with reference to FIG. 7. FIG. 7 is a sectional view schematically showing a cross-sectional structure taken along a line X-X' in FIG. 2 according to the third embodiment. Details which are not particularly referred to herein can be the same as in the first embodiment. The solid-state image sensor according to the third embodiment is formed by uniting a first member 308 and a second member 309 to each other. The first member 308 includes a semiconductor layer 104 in which photoelectric conversion elements 105 are formed, and a multilayer wiring layer 102. The second member 309 includes a semiconductor layer serving as a supporting substrate 101, and a multilayer wiring layer 122. The multilayer wiring layer 102 of the first member 308 and the multilayer wiring layer 122 of the second member 309 form one multilayer wiring layer. A semiconductor region 120 which forms transistors of a peripheral circuit portion 302 is arranged in the semiconductor layer serving as the supporting substrate 101, and gate electrodes 121 of the transistors are formed on the semiconductor layer. An SOI substrate may be used as each of the semiconductor layer 104 and supporting substrate 101.

After the first member 308 and second member 309 are formed independently of each other, the multilayer wiring layer 102 of the first member 308 and the multilayer wiring layer 122 of the second member 309 are united to each other on a uniting face 123. The semiconductor layer 104 and the semiconductor layer serving as the supporting substrate 101 can be implemented by semiconductor substrates such as silicon substrates. A method of uniting the first member 308 and the second member 309 to each other can be the same as the method of uniting the multilayer wiring layer 102 and the supporting substrate 101 to each other in the first embodiment. The multilayer wiring layer 102 of the first member 308 and the multilayer wiring layer 122 of the second member 309 has an exposed portion formed by a metal, and can be joined to each other by metal welding by uniting the first member 308 and the second member 309 to each other. Alternatively, the multilayer wiring layers 102 and 122 may be joined to each other by metal welding using micro-bumps, and an organic filler may be inserted into the gap formed between them.

Color filters 106, on-chip lenses 107, and a planarizing layer PL can be arranged on the side of a second face (back face) S2 of the semiconductor layer 104. The solid-state image sensor according to the third embodiment also serves as a back-side illumination solid-state image sensor in which light enters the photoelectric conversion elements 105 through the on-chip lenses 107 arranged on the side of the second face (back face) S2 of the semiconductor layer 104.

Openings 108 are formed to extend through the semiconductor layer 104 from the side of the second face (back face) S2 of the semiconductor layer 104, and reach an electrically conductive layer 103 arranged in either of the multilayer wiring layer 102 of the first member 308 and the multilayer wiring layer 122 of the second member 309. A trench 109 which surrounds the openings 108 is formed to extend through the semiconductor layer 104 from the side of the second face (back face) S2 of the semiconductor layer 104. The trench 109 is arranged to isolate a plurality of openings 108 from each other, as illustrated in FIG. 2. The metal electrodes 110 are arranged in the openings 108. The metal electrodes 110 can be connected to the pins of a package which encapsulates a chip 111 via bonding wires. The metal electrodes 110 are connected to the electrically conductive layer 103 in the multilayer wiring layer 102.

When the solid-state image sensor is formed upon uniting the first member 308 and the second member 309 to each other, it becomes easier to improve the sensitivity of the photoelectric conversion elements 105 and increase the pixel density. An example of how to lay out circuit elements in the first member 308 and second member 309 will be explained herein with reference to FIG. 3. A photoelectric conversion element 303 and a transfer transistor 304 can be arranged in the first member 308. An amplifier transistor 306, a reset transistor 307, and at least part of the circuit of the peripheral circuit portion 302 can be arranged in the second member 309. A control signal is supplied from the peripheral circuit portion 302 arranged in the second member 309 to the gate electrode of the transfer transistor 304 arranged in the first member 308, via a node 310 serving as a joint. A signal generated by the photoelectric conversion element 303 of the first member 308 is transferred to the drain region of the transfer transistor 304, that is, a node 305. The node 305 includes a portion arranged in the first member 308, and a portion arranged in the second member 309.

With such a configuration, compared to the case wherein all elements constituting a pixel portion are arranged in one member (that is, one substrate), the area of the photoelectric conversion element 303 can be set larger, thus improving its sensitivity. Also, compared to the case wherein all elements constituting a pixel portion are arranged in one member (that is, one substrate), the number of photoelectric conversion elements 303 can be set larger while they have the same area, thus increasing the number of pixels. Moreover, compared to the case wherein all elements constituting a pixel portion are arranged in one member (that is, one substrate), it is easier to independently form a pixel portion and a peripheral circuit portion.

Fourth Embodiment

Figure 8:
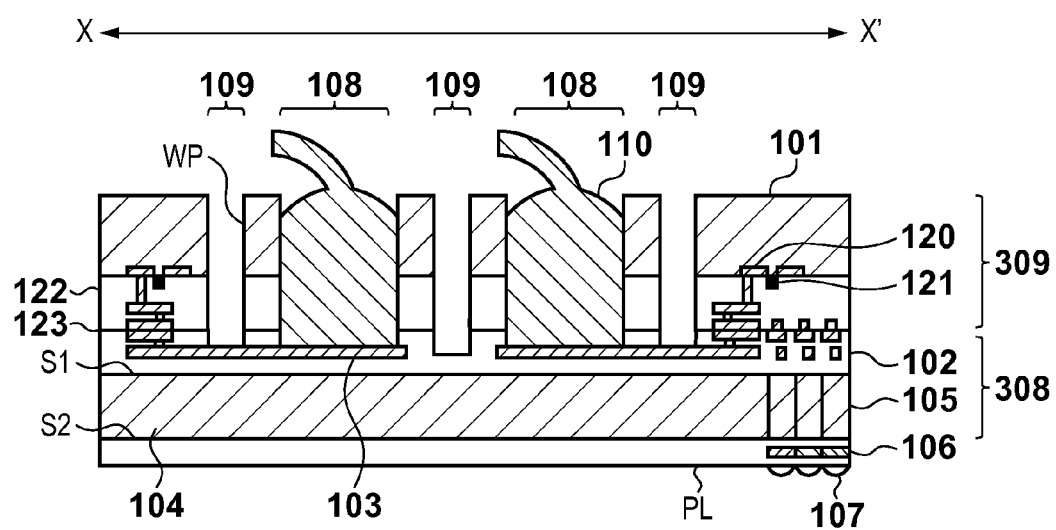
FIG. 8 is a sectional view schematically showing the cross-sectional structure of a solid-state image sensor according to the fourth embodiment.

A solid-state image sensor and a method of manufacturing the same according to the fourth embodiment of the present invention will be described with reference to FIG. 8. FIG. 8 is a sectional view schematically showing a cross-sectional structure taken along a line X-X' in FIG. 2 according to the fourth embodiment. Details which are not particularly referred to herein can be the same as in the first to third embodiments. In the fourth embodiment, openings 108, a trench 109, and metal electrodes 110 are formed in a semiconductor layer serving as a supporting substrate 101 arranged on the side of a first face S1 of a semiconductor layer (second semiconductor layer) 104 in which photoelectric conversion elements 105 are formed. This means that in the fourth embodiment, the openings 108, trench 109, and metal electrodes 110 are formed on the face, opposite to the light incident face, of the semiconductor layer 104. The solid-state image sensor according to the fourth embodiment also serves as a back-side illumination solid-state image sensor in which light enters the photoelectric conversion elements 105 through on-chip lenses 107 arranged on the side of a second face (back face) S2 of the semiconductor layer 104.

The solid-state image sensor according to the fourth embodiment is formed by uniting a first member 308 and a second member 309 to each other, as in the third embodiment. The first member 308 includes the semiconductor layer 104 in which the photoelectric conversion elements 105 are formed, and a multilayer wiring layer 102. The second member 309 includes the semiconductor layer serving as the supporting substrate 101, and a multilayer wiring layer 122. The multilayer wiring layer 102 of the first member 308 and the multilayer wiring layer 122 of the second member 309 form one multilayer wiring layer. A semiconductor region 120 which forms transistors of a peripheral circuit portion 302 is arranged in the semiconductor layer serving as the supporting substrate 101, and gate electrodes 121 of the transistors are formed on the semiconductor layer. An SOI substrate may be used as each of the semiconductor layer 104 and supporting substrate 101.

The openings 108 are formed to extend through the semiconductor layer serving as the supporting substrate 101, and reach an electrically conductive layer 103 arranged in either of the multilayer wiring layer 102 of the first member 308 and the multilayer wiring layer 122 of the second member 309. The trench 109 which surrounds the openings 108 is formed to extend through the semiconductor layer serving as the supporting substrate 101. The trench 109 is arranged to isolate a plurality of openings 108 from each other, as illustrated in FIG. 2. The semiconductor layer serving as the supporting substrate 101 may be thinned before the openings 108 and trench 109 are formed. The metal electrodes 110 are arranged in the openings 108. The metal electrodes 110 can be connected to the pins of a package which encapsulates a chip 111 via bonding wires. The metal electrodes 110 are connected to the electrically conductive layer 103 in the multilayer wiring layer 102. The metal electrodes 110 can be formed by a method such as bonding, bump formation, or plating.

Fifth Embodiment

Figure 9:
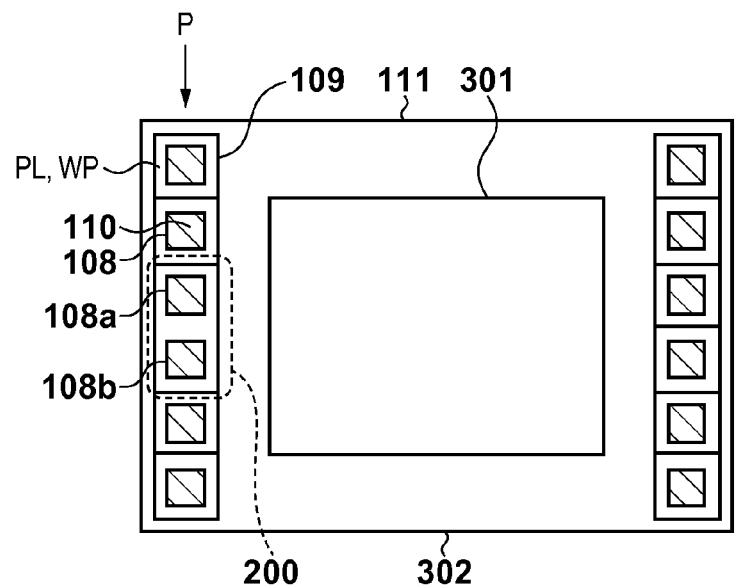
FIG. 9 is a view schematically showing the two-dimensional layout of a solid-state image sensor according to the fifth embodiment.

The fifth embodiment of the present invention will be described with reference to FIG. 9. The fifth embodiment is a modification of the relationship between openings 108 and a trench 109, and is applicable to all other embodiments. FIG. 9 is a view illustrating the two-dimensional layout of a solid-state image sensor. In the fifth embodiment, the solid-state image sensor includes a trench 109 which surrounds a plurality of openings 108a and 108b, as indicated by reference numeral 200. This means that no trench 109 is formed between the openings 108a and 108b.

Such a configuration is useful when a common voltage (for example, a power supply voltage or a ground voltage) is applied to metal electrodes 110 arranged in the openings 108a and 108b, or when identical signals are output from the metal electrodes 110 arranged in the openings 108a and 108b. Note that the power supply voltage can be, for example, 3.3 V.

Sixth Embodiment

Figure 10:
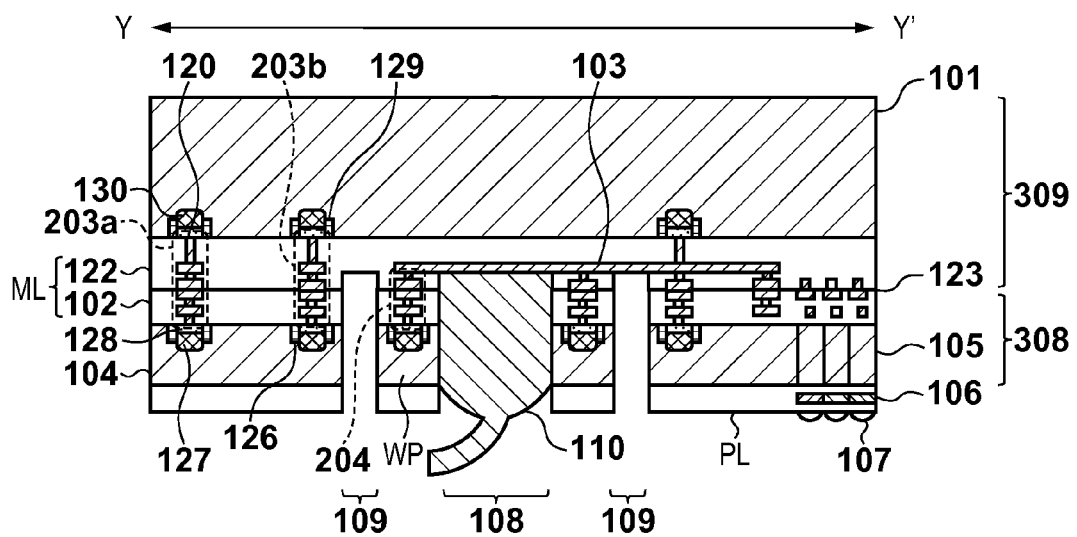
FIG. 10 is a sectional view schematically showing the cross-sectional structure of a solid-state image sensor according to the sixth embodiment.

A solid-state image sensor and a method of manufacturing the same according to the sixth embodiment of the present invention will be described with reference to FIG. 10. FIG. 10 is a sectional view schematically showing a cross-sectional structure taken along a line Y-Y' in FIG. 2 according to the sixth embodiment. Details which are not particularly referred to herein can be the same as in the first to fifth embodiments. The sixth embodiment is applicable to a solid-state image sensor formed by uniting two members to each other.

In the solid-state image sensor according to the sixth embodiment, a multilayer wiring layer 102 of a first member 308 and a multilayer wiring layer 122 of a second member 309 form one multilayer wiring layer ML. The solid-state image sensor according to the sixth embodiment includes at least one of sealing portions 203a, 203b, and 204. The sealing portion 203a is arranged in the multilayer wiring layer ML along its outer edge. The sealing portion 203b is arranged in the multilayer wiring layer ML to surround a trench 109. The sealing portion 204 is arranged between openings 108 and the trench 109 in the multilayer wiring layer ML.

An exemplary method of manufacturing a solid-state image sensor according to the sixth embodiment will be described below. First, element isolation 126 is formed in a semiconductor layer 104 of a first member 308. The element isolation 126 includes an insulation layer such as a silicon oxide film, and has, for example, the STI structure. A p-type semiconductor region 127 that can serve as a well region for forming transistors is formed in the semiconductor layer 104. A semiconductor region 128 of n-type conductivity, that can serve as a source/drain region for forming transistors is formed in the p-type semiconductor region 127. On the other hand, element isolation 129, a p-type semiconductor region 130, and an n-type semiconductor region 120 are formed in a second member 309 as well. The shape and manufacturing method of element isolation, and the concentration and depth of a semiconductor region need not be common to the first member 308 and the second member 309.

Further, photoelectric conversion elements 105 and a multilayer wiring layer 102 are formed in the first member 308, a multilayer wiring layer 122 is formed in the second member 309, and the side of the multilayer wiring layer 102 of the first member 308, and that of the multilayer wiring layer 122 of the second member 309 are united to each other on a uniting face 123. In the sixth embodiment, openings 108, a trench 109, and metal electrodes 110 are formed on the face, opposite to the light incident surface, of the semiconductor layer 104. The solid-state image sensor according to the sixth embodiment also serves as a back-side illumination solid-state image sensor in which light enters the photoelectric conversion elements 105 through on-chip lenses 107 arranged on the side of a second face (back face) S2 of the semiconductor layer 104. An SOI substrate may be used as each of the semiconductor layer 104 and supporting substrate 101.

The openings 108 are formed to extend through the semiconductor layer 104, further extend through the multilayer wiring layer 102 of the first member 308, and reach an electrically conductive layer 103 arranged in the multilayer wiring layer 122 of the second member 309. The trench 109 which surrounds the openings 108 is also formed to extend through the semiconductor layer 104, further extend through the multilayer wiring layer 102 of the first member 308, and reach the electrically conductive layer 103 arranged in the multilayer wiring layer 122 of the second member 309. The trench 109 is arranged to isolate a plurality of openings 108 from each other, as illustrated in FIG. 2. The metal electrodes 110 are arranged in the openings 108. The metal electrodes 110 can be connected to the pins of a package which encapsulates a chip 111 via bonding wires. The metal electrodes 110 are connected to the electrically conductive layer 103. The metal electrodes 110 can be formed by a method such as bonding, bump formation, or plating.

The sealing portions 203a, 203b, and 204 can be formed by the same materials as metal films, contact plugs, and via plugs, for wiring in the multilayer wiring layers 102 and 122, simultaneously with these wiring members. This means that the sealing portions 203a, 203b, and 204 can be formed by joining metal films for wiring in the multilayer wiring layers 102 and 122, and metals which form the contact plugs and via plugs to each other by metal welding.

In the sixth embodiment, the electrically conductive layer 103 is arranged in the multilayer wiring layer 122 of the second member 309. In this case, the openings 108 and trench 109 reach the electrically conductive layer 103 in the multilayer wiring layer 122 of the second member 309, as described earlier. Therefore, the openings 108 and trench 109 expose the uniting face 123, the stacked structure of the multilayer wiring layer 102, and the stacked structure of the multilayer wiring layer 122. However, according to the sixth embodiment, the sealing portions 203a, 203b, and 204 can protect the circuit elements by preventing moisture and ions from entering them from the outside.

Also, in the sixth embodiment, the sealing portions 203a, 203b, and 204 are joined to the semiconductor regions 128 and 120. A pair of semiconductor regions 128 and 120 and a pair of semiconductor regions 127 and 130 form protection diodes. Hence, the configurations of the sealing portions 203a, 203b, and 204 have a function of reducing the adverse effect of external noise.

The configurations of the sealing portions 203a, 203b, and 204 are not limited to the above-mentioned ones. For example, the sealing portion 204 may have a configuration similar to that of the sealing portions 203a and 203b. When, for example, the trench 109 extends only to the middle of the multilayer wiring layer 102 and does not reach the uniting face 123, the sealing portion 203b may be arranged only in the multilayer wiring layer 102 to surround the trench 109.

In the above-mentioned example, a semiconductor region that can serve as a well region which forms transistors is p type, while a semiconductor region that can serve as a source/drain region which forms the transistors is n type. However, this is merely an example, and a semiconductor region that can serve as a well region which forms transistors may be n type, while a semiconductor region that can serve as a source/drain region which forms the transistors may be p type.

Seventh Embodiment

Figure 11:
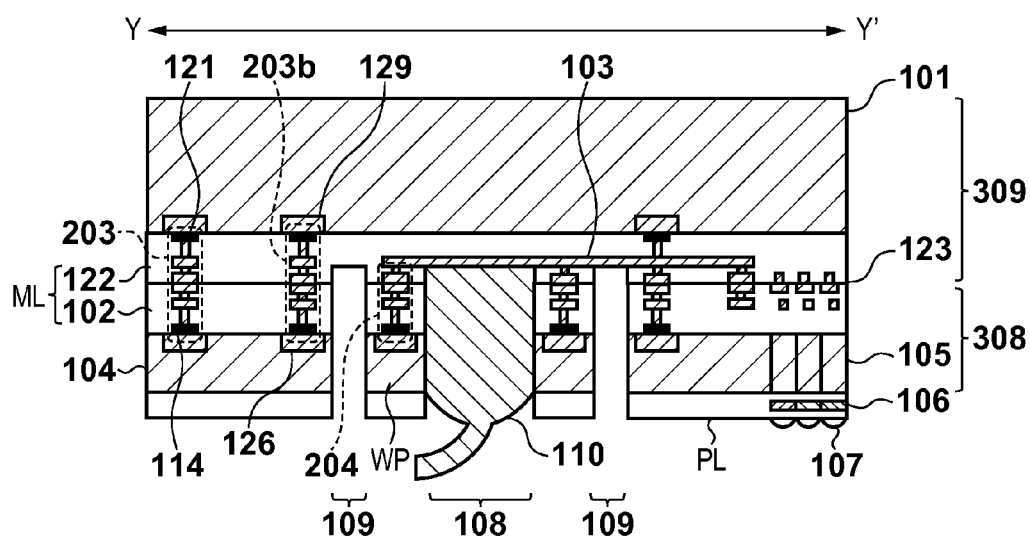
FIG. 11 is a sectional view schematically showing the cross-sectional structure of a solid-state image sensor according to the seventh embodiment.

A solid-state image sensor and a method of manufacturing the same according to the seventh embodiment of the present invention will be described with reference to FIG. 11. FIG. 11 is a sectional view schematically showing a cross-sectional structure taken along a line Y-Y' in FIG. 2 according to the seventh embodiment. Details which are not particularly referred to herein can be the same as in the first to sixth embodiments. The seventh embodiment is applicable to a solid-state image sensor formed by uniting two members to each other.

In the solid-state image sensor according to the seventh embodiment, a multilayer wiring layer 102 of a first member 308 and a multilayer wiring layer 122 of a second member 309 form one multilayer wiring layer ML. The solid-state image sensor according to the seventh embodiment includes at least one of sealing portions 203a, 203b, and 204. The sealing portion 203a is arranged in the multilayer wiring layer ML along its outer edge. The sealing portion 203b is arranged in the multilayer wiring layer ML to surround a trench 109. The sealing portion 204 is arranged between openings 108 and the trench 109 in the multilayer wiring layer ML.

An exemplary method of manufacturing a solid-state image sensor according to the seventh embodiment will be below. First, element isolation 126 is formed in a semiconductor layer 104 of a first member 308. The element isolation 126 includes an insulation layer such as a silicon oxide film, and has, for example, the STI structure. Gate oxide film (not shown) and gate electrodes 114 are formed in the semiconductor layer 104. On the other hand, element isolation 129, gate oxide film (not shown), and gate electrodes 121 are formed in a second member 309 as well. The shape and manufacturing method of element isolation, and the thicknesses and types of gate oxide film and gate electrodes need not be common to the first member 308 and the second member 309.

Further, photoelectric conversion elements 105 and a multilayer wiring layer 102 are formed in the first member 308, a multilayer wiring layer 122 is formed in the second member 309, and the side of the multilayer wiring layer 102 of the first member 308, and that of the multilayer wiring layer 122 of the second member 309 are united to each other on a uniting face 123. In the seventh embodiment, openings 108, a trench 109, and metal electrodes 110 are formed on the face, opposite to the light incident surface, of the semiconductor layer 104. The solid-state image sensor according to the seventh embodiment also serves as a back-side illumination solid-state image sensor in which light enters the photoelectric conversion elements 105 through on-chip lenses 107 arranged on the side of a second face (back face) S2 of the semiconductor layer 104. An SOI substrate may be used as each of the semiconductor layer 104 and supporting substrate 101.

The openings 108 are formed to extend through the semiconductor layer 104, further extend through the multilayer wiring layer 102 of the first member 308, and reach an electrically conductive layer 103 arranged in the multilayer wiring layer 122 of the second member 309. The trench 109 which surrounds the openings 108 is also formed to extend through the semiconductor layer 104, further extend through the multilayer wiring layer 102 of the first member 308, and reach the electrically conductive layer 103 arranged in the multilayer wiring layer 122 of the second member 309. The trench 109 is arranged to isolate a plurality of openings 108 from each other, as illustrated in FIG. 2. The metal electrodes 110 are arranged in the openings 108. The metal electrodes 110 can be connected to the pins of a package which encapsulates a chip 111 via bonding wires. The metal electrodes 110 are connected to the electrically conductive layer 103 in the multilayer wiring layer 102. The metal electrodes 110 can be formed by a method such as bonding, bump formation, or plating.

The sealing portions 203a, 203b, and 204 can be formed by the same materials as metal films, contact plugs, and via plugs, for wiring in the multilayer wiring layers 102 and 122, simultaneously with these wiring members. This means that the sealing portions 203a, 203b, and 204 can be formed by joining metal films for wiring in the multilayer wiring layers 102 and 122, and metals which form the contact plugs and via plugs to each other by metal welding. The same effect as in the sixth embodiment can also be obtained in the seventh embodiment.

Eighth Embodiment

Figure 12:
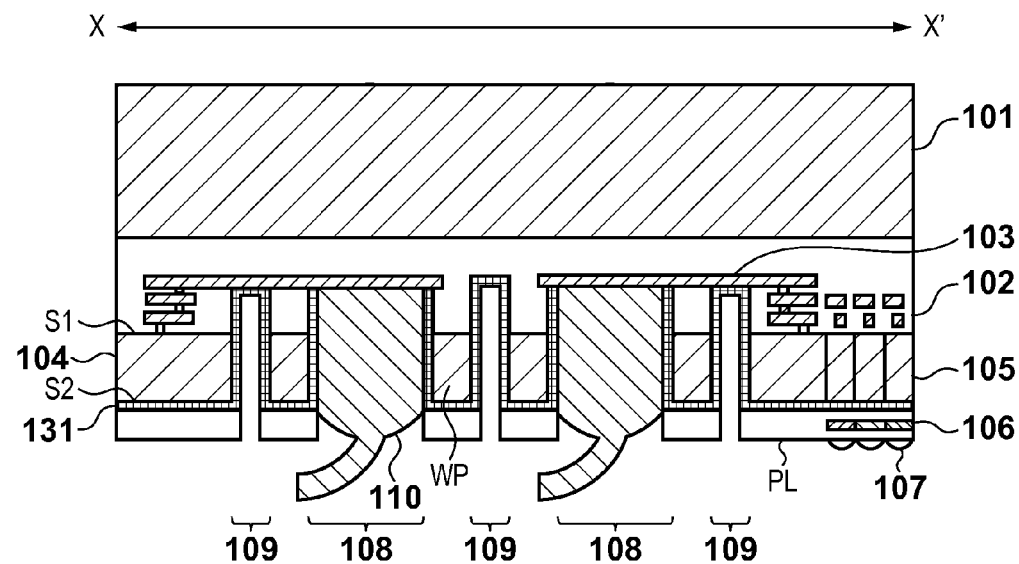
FIG. 12 is a sectional view schematically showing the cross-sectional structure of a solid-state image sensor according to the eighth embodiment.

A solid-state image sensor and a method of manufacturing the same according to the eighth embodiment of the present invention will be described with reference to FIG. 12. FIG. 12 is a sectional view schematically showing a cross-sectional structure taken along a line X-X' in FIG. 2 according to the eighth embodiment. Details which are not particularly referred to herein can be the same as in the first to seventh embodiments. The solid-state image sensor according to the eighth embodiment includes a protecting layer 131 which protects the face of a semiconductor layer 104, which is exposed upon formation of openings 108 and a trench 109.

A solid-state image sensor according to the eighth embodiment can be manufactured in accordance with the manufacturing method of the first embodiment until a semiconductor layer 104 is formed and thinned. After the semiconductor layer 104 is thinned, openings 108 and a trench 109 are formed in the semiconductor layer 104 and a multilayer wiring layer 102. The openings 108 are formed to extend through the semiconductor layer 104, and reach an electrically conductive layer 103. The trench 109 is formed to extend through the semiconductor layer 104 and isolate a plurality of openings 108 from each other.

After the openings 108 and trench 109 are formed, a film such as a silicon nitride film that can serve as a protecting layer is formed to cover a second face (back face) S2 of the semiconductor layer 104, and a side face exposed to the openings 108 and trench 109 by a method such as the plasma CVD method. Color filters 106, on-chip lenses 107, and a planarizing layer PL are formed on the side of the second face (back face) S2 of the semiconductor layer 104.

The silicon nitride film at the bottom portions of the planarizing layer PL and openings 108 in the portion which covers the openings 108 and trench 109 is removed by, for example, etching to expose the electrically conductive layer 103, thereby forming a protecting layer 131 made of a silicon nitride film. Metal electrodes 110 are formed in the openings 108. The metal electrodes 110 are formed to be connected to the electrically conductive layer 103. The metal electrodes 110 can be formed by a method such as bonding, bump formation, or plating. The metal electrodes 110 can be formed by a material such as gold, silver, or aluminum. The order of formation of a planarizing layer PL, color filters 106, and on-chip lenses 107, and formation of a protecting layer 131 may be reverse to the above case. A combination of the eighth embodiment and the sixth or seventh embodiment can further improve the sealing effect.

According to the eighth embodiment, the protecting layer 131 protects not only the second face (back face) S2 of the semiconductor layer 104, but also the side faces defining the openings 108 and trench 109.

Ninth Embodiment

Figure 13A:
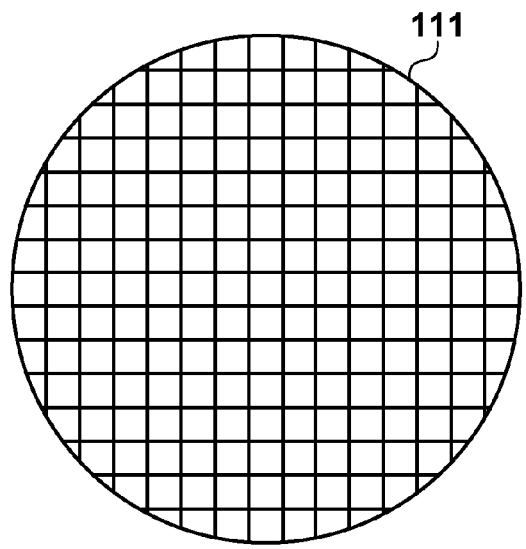
FIGS. 13A and 13B are views schematically showing a wafer on which solid-state image sensors according to the ninth embodiment are arrayed.
Figure 13B:
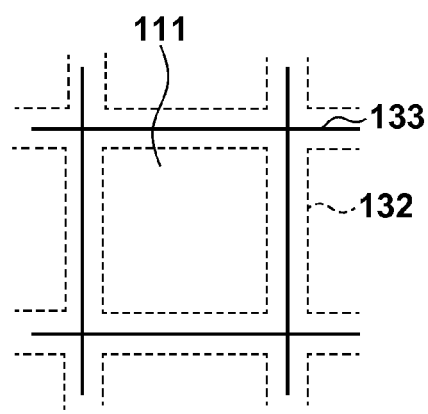
Figure 14:
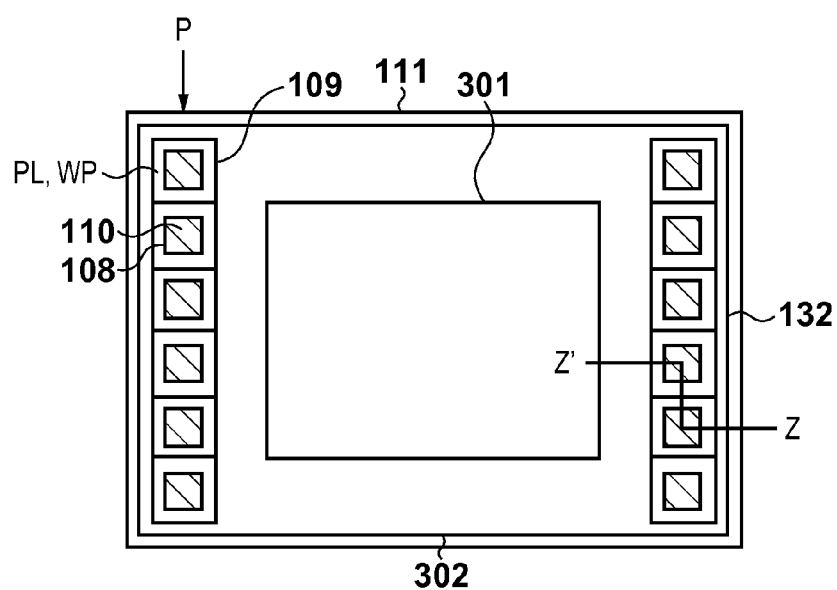
FIG. 14 is a view schematically showing the two-dimensional layout of the solid-state image sensor according to the ninth embodiment.
Figure 15:
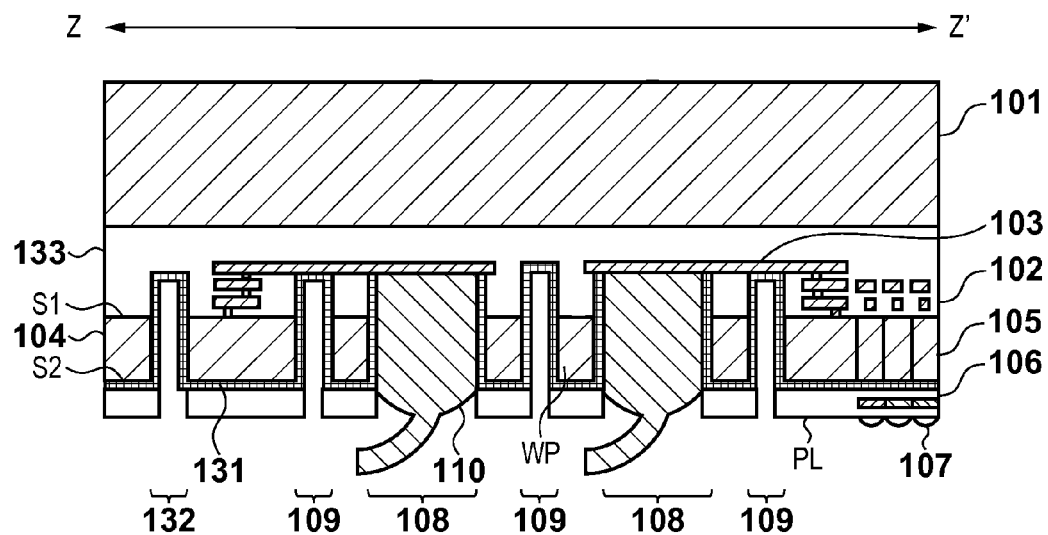
FIG. 15 is a sectional view schematically showing the cross-sectional structure of the solid-state image sensor according to the ninth embodiment.

A solid-state image sensor and a method of manufacturing the same according to the ninth embodiment of the present invention will be described with reference to FIGS. 13A, 13B, 14, and 15. Details which are not particularly referred to herein can be the same as in the first to eighth embodiments. FIG. 13A is a plan view showing a wafer on which solid-state image sensors are formed, FIG. 13B is a view schematically showing one chip 111 and its surrounding portion on the wafer, and FIG. 14 is a view schematically showing the two-dimensional layout of the chip 111. FIG. 15 is a sectional view schematically showing a cross-sectional structure taken along a line Z-Z' in FIG. 14.

The solid-state image sensor according to the ninth embodiment includes a second trench 132 arranged inside the outer edge of the chip 111 (a semiconductor layer 104 when viewed from another perspective) along this outer edge. The second trench 132 can isolate the outer edge of the chip 111, and the interior of the chip 111 from each other. The second trench 132 also has a function of preventing cracks from being formed inside the chip 111 as the wafer is diced along dicing lines 133. The feature of the ninth embodiment can be practiced in combination with any of those of the first to eighth embodiments.

A solid-state image sensor according to the ninth embodiment can be manufactured in accordance with the manufacturing method of the first embodiment until a semiconductor layer 104 is formed and thinned. After the semiconductor layer 104 is thinned, openings 108, a trench 109, and a second trench 132 are formed in the semiconductor layer 104 and a multilayer wiring layer 102. The openings 108 are formed to extend through the semiconductor layer 104, and reach an electrically conductive layer 103. The trench 109 is formed to extend through the semiconductor layer 104 and isolate a plurality of openings 108 from each other. The second trench 132 is formed inside the outer edge of the semiconductor layer 104 along this outer edge (the dicing lines 133 when viewed from another perspective) to extend through the semiconductor layer 104.

After the openings 108, trench 109, and second trench 132 are formed, a film such as a silicon nitride film that can serve as a protecting layer is formed by a method such as the plasma CVD method to cover a second face (back face) S2 of the semiconductor layer 104, and the side faces exposed to the openings 108, trench 109, and second trench 132. Color filters 106, on-chip lenses 107, and a planarizing layer PL can be arranged on the side of the second face (back face) S2 of the semiconductor layer 104.

The silicon nitride film at the bottom portions of the planarizing layer PL and openings 108 in the portion which covers the openings 108 and trench 109 is removed by, for example, etching to expose the electrically conductive layer 103, thereby forming a protecting layer 131 made of a silicon nitride film. Metal electrodes 110 are formed in the openings 108. The metal electrodes 110 are formed to be connected to the electrically conductive layer 103. The metal electrodes 110 can be formed by a method such as bonding, bump formation, or plating. The metal electrodes 110 can be formed by a material such as gold, silver, or aluminum. The order of formation of a planarizing layer PL, color filters 106, and on-chip lenses 107, and formation of a protecting layer 131 may be reverse to the above case. Also, a wafer on which a plurality of solid-state image sensors (chips 111) are formed is cut along the dicing lines 133 to obtain a configuration schematically shown in FIG. 15.

According to the ninth embodiment, it is possible not only to protect the second face (back face) S2 of the semiconductor layer 104, and the side faces, but also to prevent cracks from being formed inside the chip 111 upon dicing. Also, formation of openings 108 for forming metal electrodes 110, formation of a trench 109 for electrically isolating a plurality of metal electrodes 110 from each other, and formation of a second trench 132 for preventing cracks from being formed inside the chip 111 upon dicing can be performed simultaneously.

10th Embodiment

Figure 16:
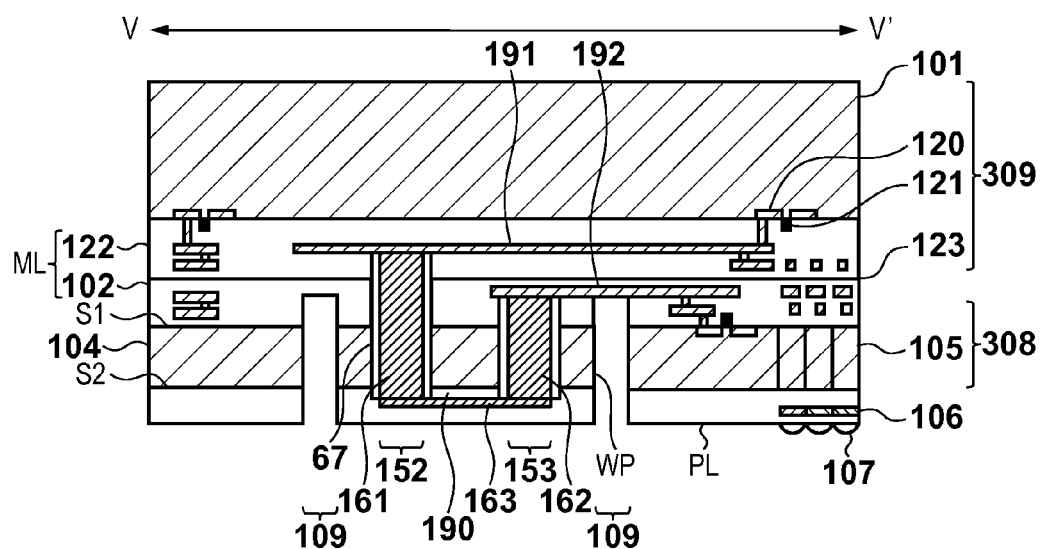
FIG. 16 is a sectional view schematically showing the cross-sectional structure of a solid-state image sensor according to the 10th embodiment.
Figure 17:
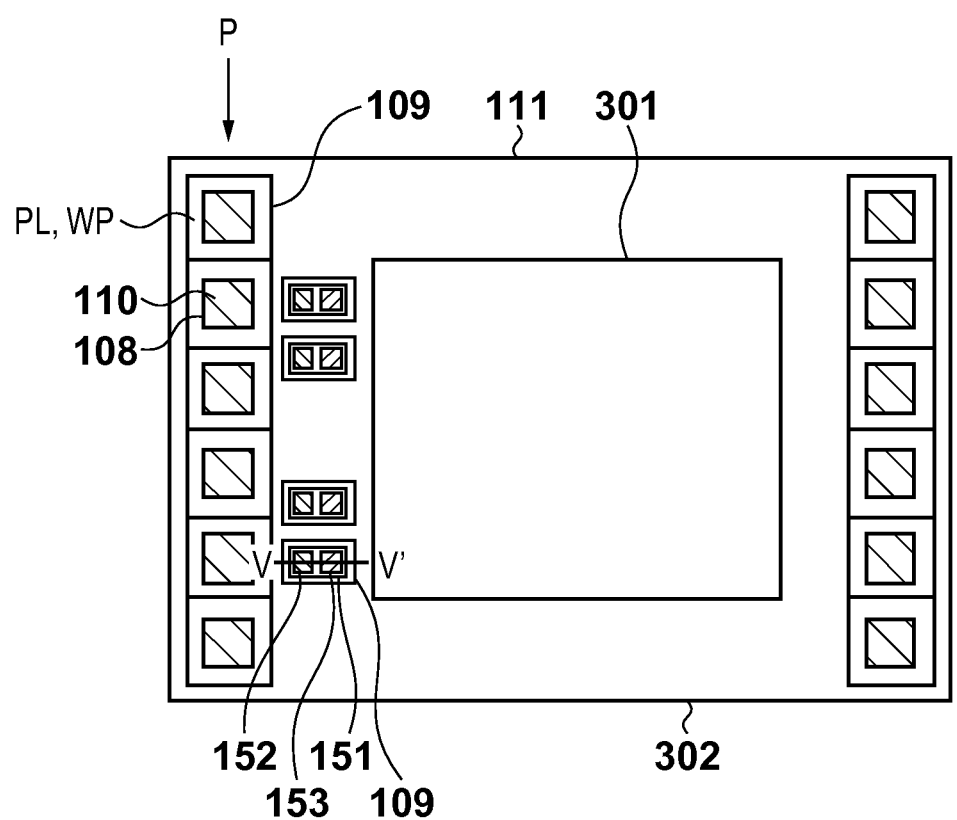
FIG. 17 is a view schematically showing the two-dimensional layout of the solid-state image sensor according to the 10th embodiment.

A solid-state image sensor and a method of manufacturing the same according to the 10th embodiment of the present invention will be described with reference to FIGS. 16 and 17. Details which are not particularly referred to herein can be the same as in the first to ninth embodiments. FIG. 17 is a view schematically showing the two-dimensional layout of the solid-state image sensor (chip). FIG. 16 is a sectional view schematically showing a cross-sectional structure taken along a line V-V' in FIG. 17.

In the 10th embodiment, an interconnection of a multilayer wiring layer 102 of a first member 308, and an interconnection of a multilayer wiring layer 122 of a second member 309 are connected to each other via electrically conductive members 161 and 162 and a connecting portion 163. The feature of the 10th embodiment can be practiced in combination with any of those of the first to ninth embodiments.

An operation until the first member 308 and second member 309 are united to each other can be performed in accordance with the method in the third embodiment (FIG. 7). However, the multilayer wiring layer 102 of the first member 308 and the multilayer wiring layer 122 of the second member 309 are formed so their interconnections are not connected to each other upon this uniting operation. After the first member 308 and the second member 309 are united to each other, an insulation film 190 is formed on a second face (back face) S2 of a semiconductor layer 104. The insulation film 190 can function as a planarizing layer (the above-mentioned planarizing layer PL1). Openings 152 and 153 are formed to extend through the insulation film 190 and semiconductor layer 104, and reach electrically conductive layers 191 and 192 to be connected to each other in a multilayer wiring layer ML. After an insulation film 67 is formed on the side faces defining openings 151 and 153 as needed, electrically conductive members 161 and 162 are formed in the openings 152 and 153, respectively. A connecting portion 163 is formed to connect the electrically conductive members 161 and 162, formed in the openings 152 and 153, respectively, to each other.

Color filters 106, on-chip lenses 107, and a planarizing layer PL can be arranged on the side of the second face (back face) S2 of the semiconductor layer 104. A trench 109 is formed to surround the region where the openings 151 and 152 and connecting portion 163 are arranged. The trench 109 may be formed simultaneously with the openings 151 and 152. The trench 109 is similar to that which surrounds the metal electrodes 110, described in the first to ninth embodiments.

The connecting portion 163 may be used as a pad. Although not shown in FIG. 16, the solid-state image sensor according to the 10th embodiment includes metal electrodes 110 for bonding, as shown in FIG. 17.

Application Example

An exemplary camera built into the solid-state image sensor according to each of the above-mentioned embodiments will be described as an application example of this solid-state image sensor. The concept of the camera includes not only an apparatus mainly intended for image capture but also an apparatus (for example, a personal computer and a portable terminal) additionally provided with an image capture function. The camera includes a solid-state image sensor according to the present invention, as illustrated in each of the above-mentioned embodiments, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-044299, filed Feb. 29, 2012, which is hereby incorporated by reference herein in its entirety.

What is claimed is:

1. A solid-state image sensor comprising:
   a semiconductor layer;
   a multilayer wiring layer arranged on a side of a first face of the semiconductor layer, the multilayer wiring layer including two insulating layers and an electrically conductive layer provided between the two insulating layers; and
   an electrically conductive member which is arranged in the opening and in contact with the electrically conductive layer,
   wherein the semiconductor layer and the multilayer wiring layer include a wall portion including a first side face and a second side face, the first side face of the wall portion defines the opening which extends from a second face of the semiconductor layer to the electrically conductive layer in the multilayer wiring layer, the second face of the semiconductor layer being opposite to the first face of the semiconductor layer, and the second side face of the wall portion defines a trench which surrounds the opening and extends from the second face of the semiconductor layer into the multilayer wiring layer, the trench having a depth that is not less than a depth of the opening.

2. The sensor according to claim 1, wherein a photoelectric conversion element is provided in the semiconductor layer.

3. The sensor according to claim 2, wherein the solid-state image sensor is configured such that light enters the photoelectric conversion element from a side of the second face.

4. The sensor according to claim 1, further comprising a substrate, wherein the electrically conductive layer is one layer of the multilayer wiring layer arranged between the substrate and the semiconductor layer.

5. The sensor according to claim 4, wherein a transistor is provided in the substrate.

6. The sensor according to claim 4, wherein the electrically conductive member electrically connects the electrically conductive layer with another layer of the multilayer wiring layer.

7. The sensor according to claim 1, further comprising at least one of:
   a sealing portion arranged in the multilayer wiring layer to surround the trench;
   a sealing portion arranged between the opening and the trench and in the multilayer wiring layer; and
   a sealing portion arranged in the multilayer wiring layer along an outer edge of the multilayer wiring layer.

8. The sensor according to claim 1, further comprising a protecting layer which covers at least one of the first side face and the second face of the wall portion.

9. The sensor according to claim 8, wherein the protecting layer is in contact with the electrically conductive layer.

10. The sensor according to claim 1, wherein a space with no solid substance is present in the trench.

11. The sensor according to claim 1, wherein the trench surrounds a plurality of openings which include the opening.

12. The sensor according to claim 1, wherein the electrically conductive member is a bonding wire or electrically connects the electrically conductive layer with another electrically conductive layer.

13. The sensor according to claim 1, further comprising another wall portion having a side face defining another trench which is arranged along an outer edge of the semiconductor layer and extends from the second face of the semiconductor layer to the multilayer wiring layer.

14. The sensor according to claim 1, further comprising a photoelectric conversion layer,
wherein the electrically conductive layer is arranged between the semiconductor layer and the photoelectric conversion layer.

15. The sensor according to claim 14, wherein the photoelectric conversion layer includes a first face and a second face that are opposite to each other, the electrically conductive layer is arranged on a side of the first face of the photoelectric conversion layer, and the solid-state image sensor is configured such that light enters the photoelectric conversion layer from a side of the second face.

16. The sensor according to claim 14, wherein a transistor is provided in the photoelectric conversion layer.

17. The sensor according to claim 1, wherein the trench reaches the electrically conductive layer.

18. The sensor according to claim 1, wherein the trench has a depth that is more than a depth of the opening.

19. The sensor according to claim 1, wherein part of the trench has a depth which is different from a depth of another part of the trench.

20. The sensor according to claim 1, wherein
one of the two insulating layers closer to the semiconductor layer is a first insulating layer and the other of the two insulating layers is a second insulating layer, and
part of the trench reaches the electrically conductive layer through the semiconductor layer and the first insulating layer.

21. The sensor according to claim 1, wherein,
one of the two insulating layers closer to the semiconductor layer is a first insulating layer and the other is a second insulating layer,
part of the trench has a bottom defined by the electrically conductive layer and the other part of the trench has a bottom in the second insulating layer.

22. A solid-state image sensor comprising:
a semiconductor layer;
a multilayer wiring layer arranged on a side of a first face of the semiconductor layer, the multilayer wiring layer including two insulating layers and an electrically conductive layer provided between the two insulating layers;
an electrically conductive member which is arranged in the opening and in contact with the electrically conductive layer; and
a color filter and an on-chip lens which are arranged on the bottom face of the semiconductor layer, wherein the semiconductor layer and the multilayer wiring layer include a wall portion including a first side face and a second side face, the first side face of the wall portion defines the opening which extends from a second face of the semiconductor layer to the electrically conductive layer in the multilayer wiring layer, the second face of the semiconductor layer being opposite to the first face of the semiconductor layer, and the second side face of the wall portion defines a trench which surrounds the opening and extends from the second face of the semiconductor layer into the multilayer wiring layer, the trench having a depth that is not less than a depth of the opening.

23. The sensor according to claim 22, wherein the trench has a depth that is more than a depth of the opening.

24. The sensor according to claim 22, wherein part of the trench has a depth which is different from a depth of another part of the trench.

25. A camera comprising:
a solid-state image sensor comprising:
a semiconductor layer;
a multilayer wiring layer arranged on a side of a first face of the semiconductor layer, the multilayer wiring layer including two insulating layers and an electrically conductive layer provided between the two insulating layers, and
an electrically conductive member which is arranged in the opening and in contact with the electrically conductive layer; and
a processor which processes a signal output from the solid-state image sensor,
wherein the semiconductor layer and the multilayer wiring layer include a wall portion including a first side face and a second side face, the first side face of the wall portion defines the opening which extends from a second face of the semiconductor layer to the electrically conductive layer in the multilayer wiring layer, the second face of the semiconductor layer being opposite to the first face of the semiconductor layer, and the second side face of the wall portion defines a trench which surrounds the opening and extends from the second face of the semiconductor layer into the multilayer wiring layer, the trench having a depth that is not less than a depth of the opening.

* * * * *